United States Patent
Kurozumi

(10) Patent No.: US 7,782,687 B2
(45) Date of Patent: Aug. 24, 2010

(54) SEMICONDUCTOR DEVICE

(75) Inventor: Tomohiro Kurozumi, Kyoto (JP)

(73) Assignee: Panasonic Corporation, Osaka (JP)

( * ) Notice: Subject to any disclaimer, the term of this patent is extended or adjusted under 35 U.S.C. 154(b) by 169 days.

(21) Appl. No.: 12/252,974

(22) Filed: Oct. 16, 2008

(65) Prior Publication Data
US 2009/0097334 A1    Apr. 16, 2009

(30) Foreign Application Priority Data
Oct. 16, 2007  (JP)  ............... 2007-268870

(51) Int. Cl.
*G11C 29/00* (2006.01)
(52) U.S. Cl. ............... 365/200; 365/201; 365/230.03
(58) Field of Classification Search ............... 365/200, 365/201, 230.03
See application file for complete search history.

(56) References Cited

U.S. PATENT DOCUMENTS

| | | | | |
|---|---|---|---|---|
| 5,822,257 A | * | 10/1998 | Ogawa | ............ 365/200 |
| 5,862,097 A | * | 1/1999 | Toda | ............ 365/230.03 |
| 5,999,463 A | | 12/1999 | Park et al. | |
| 6,556,490 B2 | | 4/2003 | Shubat et al. | |
| 6,804,156 B2 | | 10/2004 | Ito | |
| 6,937,533 B2 | | 8/2005 | Hojo et al. | |
| 2007/0258296 A1 | | 11/2007 | Bright et al. | |

* cited by examiner

*Primary Examiner*—Huan Hoang
(74) *Attorney, Agent, or Firm*—McDermott Will & Emery LLP

(57) ABSTRACT

In a semiconductor device having a redundant memory, the area of the device is reduced and a time required to transfer relief information is reduced. Moreover, a transfer control of relief information is facilitated. A first relief information storing unit stores relief information for relieving a redundant memory having a defective cell. A plurality of redundant memories share a second relief information storing unit. The second relief information storing unit is connected in series to the first relief information storing unit. The relief information is transferred from the first relief information storing unit to the second relief information storing unit.

8 Claims, 4 Drawing Sheets

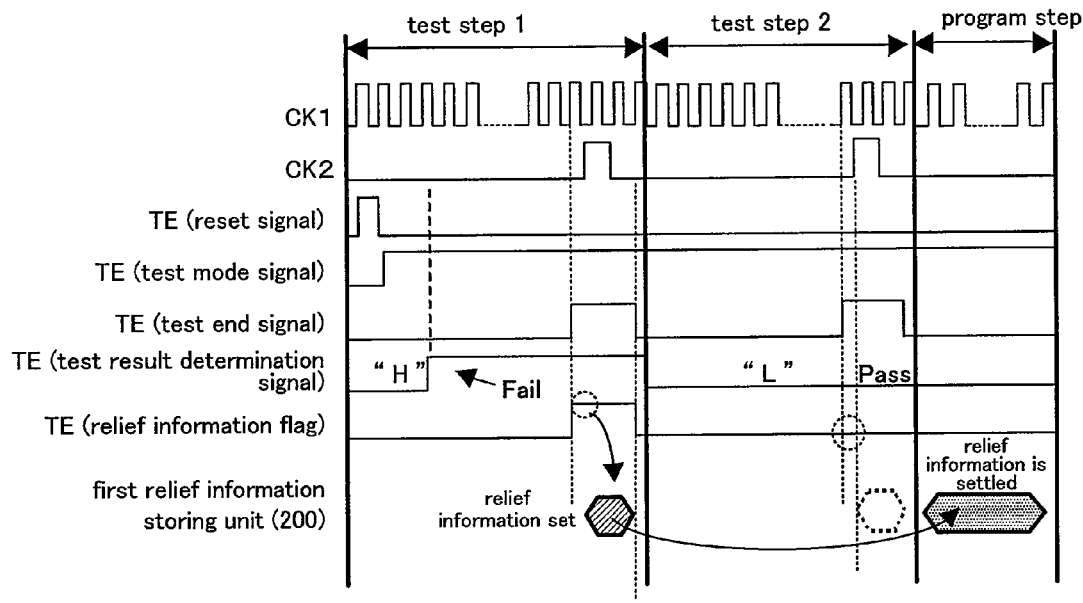
FIG. 2A  test phase
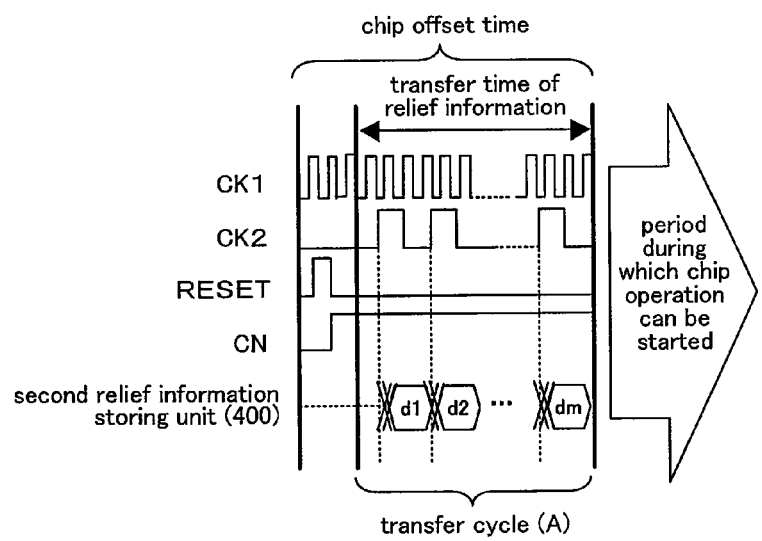
FIG. 2B  actual chip operation phase

SEMICONDUCTOR DEVICE

CROSS REFERENCE TO RELATED APPLICATIONS

This Non-provisional application claims priority under 35 U.S.C. §119(a) on Patent Application No. 2007-268870 filed in Japan on Oct. 16, 2007, the entire contents of which are hereby incorporated by reference.

BACKGROUND OF THE INVENTION

1. Field of the Invention

The present invention relates to a semiconductor device having a so-called redundant memory.

2. Description of the Related Art

Conventionally, a method for efficiently transferring relief information (repairing/replacement information) to a memory with a redundancy scheme (hereinafter simply referred to as a "redundant memory") in which a defect occurring in a memory array can be relieved (repaired/replaced), has been proposed (see, for example, Patent Document 1).

Patent Document 1: U.S. Pat. No. 6,556,490

SUMMARY OF THE INVENTION

As the scale of a system LSI increases, the total capacity or the number of memories mounted on a chip increases. Also, the proportion of redundant memories used in a chip is increasing so as to improve the process yield of a semiconductor device. Therefore, the area of circuits and wiring for a redundancy scheme increases, resulting in a significant impact on the chip area.

To avoid this, for example, in the conventional technique of Patent Document 1, a means for storing relief information, such as a scan flip-flop or the like, is provided in each redundant memory, and these means are connected in a daisy chain and are also connected to a fuse box provided outside the redundant memory. Relief information is serially transferred from the fuse box to a predetermined redundant memory.

However, in this technique, the number of required relief information storing means is equal to the number of redundant memories. Therefore, the area of the whole chip increases. Also, a time required for relief information to be transferred from a fuse box to a redundant memory increases in proportion to the number of scan flip-flops connected in the chain. Moreover, the number of scan flip-flops for storing relief information of each redundant memory varies depending on the structure of the redundant memory. Therefore, a complicated control is required to perform a shifting operation for transferring relief information from a fuse box to a predetermined redundant memory.

In view of the problems described above, an object of the present invention is to provide a semiconductor device having a redundant memory in which the area of the device is reduced and the transfer time of relief information is also reduced. Another object of the present invention is to further simplify a transfer control of relief information.

A semiconductor device according to the present invention includes a plurality of redundant memories each having a plurality of memory cells and having a function of relieving (repairing/replacing) a defective cell that is a defective one of the plurality of memory cells, where the plurality of redundant memories can each operate independently, a first relief information storing unit for storing relief information (repairing/replacement information) for relieving (repairing/replacing) the redundant memory having a defective cell, and a second relief information storing unit for receiving and storing the relief information transferred from the first relief information storing unit. The second relief information storing unit is provided outside the redundant memory and is shared by the plurality of redundant memories, and the plurality of redundant memories can execute a relief process with respect to a defective cell using the relief information stored in the second relief information storing unit.

According to the present invention, the second relief information storing unit to which relief information is transferred from the first relief information storing unit is provided outside the redundant memory and are shared by the plurality of redundant memories. Therefore, the number of second relief information storing units can be significantly reduced. Even if the number of mounted redundant memories increases, the number of second relief information storing units can be suppressed from increasing, so that the device circuit can be reduced. Also, since the number of second relief information storing units is reduced, a transfer cycle required to transfer relief information from the first relief information storing unit can be reduced. Therefore, a time required to transfer relief information after power is turned on can be reduced.

In the semiconductor device of the present invention, the first and second relief information storing units each preferably have shift registers for storing the relief information and are each preferably configured to successively transfer the relief information by a shifting operation of the shift registers.

Further, a plurality of combinations each including the plurality of redundant memories and the second relief information storing unit are preferably provided. The plurality of the second relief information storing units are preferably connected in series to the first relief information storing unit so that the relief information can be successively transferred.

Thereby, since the plurality of second relief information storing units are connected in series to the first relief information storing unit, relief information can be easily transferred from the first relief information storing unit.

Further, the plurality of the second relief information storing units preferably have the same number of the shift registers.

Thereby, the number of clocks required to transfer relief information to each second relief information storing unit can be easily set, so that a complicated control for transferring relief information is not required.

Also, in the semiconductor device of the present invention, the plurality of redundant memories preferably have a different bit configuration or word configuration, and share the whole or a portion of the relief information stored in the second relief information storing unit.

Also, in the semiconductor device of the present invention, the first relief information storing unit preferably has an electrical fuse element for storing the relief information.

Also, in the semiconductor device of the present invention, the first relief information storing unit preferably has a non-volatile memory element for storing the relief information.

Also, in the semiconductor device of the present invention, the relief information is directly preferably transferred from shift registers included in the first relief information storing unit to shift registers included in the second relief information storing unit.

As described above, according to the present invention, the number of second relief information storing units that would otherwise increase in proportion to the number of mounted redundant memories can be significantly reduced, so that the number of conforming products can be increased.

Also, a time required to transfer relief information after power is turned on can be reduced, so that an offset time until the start of a chip operation can be reduced. Further, a complicated control for transferring relief information is not required, resulting in a reduction in area of a control circuit.

BRIEF DESCRIPTION OF THE DRAWINGS

FIGS. 2A and 2B are timing charts showing an operation relating to repairing/replacement by a redundancy scheme of the semiconductor device of the first embodiment. FIG. 2A shows a test phase and FIG. 2B shows an actual chip operation phase.

DETAILED DESCRIPTION OF THE PREFERRED EMBODIMENTS

Hereinafter, embodiments of the present invention will be described with reference to the accompanying drawings.

First Embodiment

Figure 1:
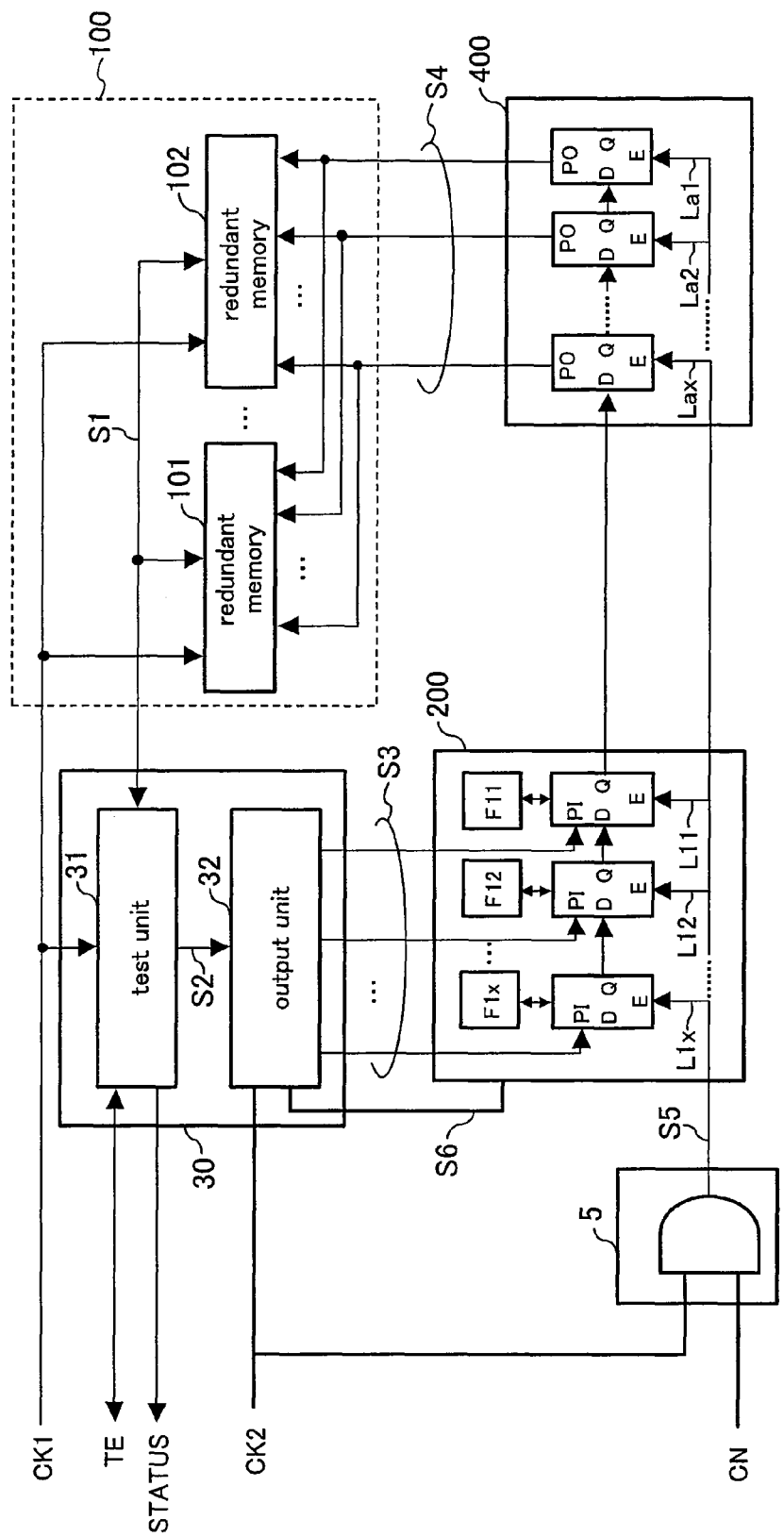
FIG. 1 is a block diagram showing a configuration of a semiconductor device according to a first embodiment of the present invention.

FIG. 1 is a block diagram showing a configuration of a semiconductor device according to a first embodiment of the present invention. FIGS. 2A and 2B are timing charts showing an operation relating to repairing/replacement by a redundancy scheme of the semiconductor device of this embodiment. FIG. 2A shows a test phase and FIG. 2B shows an actual chip operation phase.

In FIG. 1, the semiconductor device comprises redundant memories 101 and 102 having a plurality of memory cells and having a function of relieving (repairing/replacing) a defective memory cell (defective cell), a first relief information storing unit 200 for storing relief information (repairing/replacement information) for relieving (repairing/replacing) the redundant memories 101 and 102 having a defective cell, and a second relief information storing unit 400 for receiving and storing relief information transferred from the first relief information storing unit 200. The second relief information storing unit 400 is shared by the redundant memories 101 and 102 and is provided outside the redundant memories 101 and 102. The redundant memories 101 and 102 can execute a relief (repairing/replacement) process with respect to a defective cell using relief information S4 stored in the second relief information storing unit 400. Note that even if the second relief information storing unit 400 is shared by three or more redundant memories, a similar effect is obtained, however, only two redundant memories are illustrated for the sake of simplicity. Reference numeral 100 indicates a redundant memory group including the redundant memories 101 and 102. Note that the redundant memories 101 and 102 may have different bit configurations or word configurations. In this case, the whole or a portion of the relief information S4 stored in the second relief information storing unit 400 may be shared by the redundant memories 101 and 102.

The first relief information storing unit 200 comprises shift registers L11, L12, and L1$x$ and electrical fuse elements F11, F12, . . . , and F1$x$. Relief information stored in the shift registers L11, L12, . . . , and L1$x$ is used as program information for the electrical fuse elements F11, F12, . . . , and F1$x$, respectively. In other words, the electrical fuse elements F11, F12, . . . , and F1$x$ have a role of storing relief information. Note that, instead of the electrical fuse element, a non-volatile memory element capable of holding relief information when power is off may be employed. The second relief information storing unit 400 also comprises shift registers La1, La2, . . . , and La$x$ for storing relief information. The shift registers L11, L12, . . . , and L1$x$ included in the first relief information storing unit 200 and the shift registers La1, La2, . . . , and La$x$ included in the second relief information storing unit 400 are each serially connected so that data (i.e., relief information) can be successively transferred by their shifting operations.

With the configuration described above, since a second relief information storing unit (400) is shared by a plurality of redundant memories (101 and 102), the number of second relief information storing units (400) can be reduced, resulting in an reduction in device area. Recently, as the scale of a system LSI increases, the number of redundant memories mounted thereon tends to increase. In contrast to this, the number of redundant memories that are actually relieved is considerably small for the number of all redundant memories mounted on a chip. Therefore, if a configuration in which a second relief information storing unit (400) is shared by a plurality of redundant memories (101 and 102), is employed in view of a predicted process integrity, a reduction in yield can be avoided. More preferably, the chip area is reduced, so that the number of chips per wafer increases, i.e., the number of conforming products can be increased. Therefore, according to this embodiment, the number of second relief information storing units that conventionally increases in proportion to the number of redundant memories mounted on a chip can be significantly reduced, thereby making it possible to increase the number of conforming products.

Although FIG. 1 shows a test circuit 30 and a clock control unit 5 and signal lines input thereto and output therefrom, which will be described below, these elements are shown so as to describe this embodiment, and are not components essential for the effect of the present invention.

The test circuit 30 comprises a testing unit 31 for testing the redundant memories 101 and 102, and an output unit 32 for outputting relief information S3 for relieving a defective cell. The testing unit 31 receives an external test signal group TE and performs a desired test with respect to the redundant memories 101 and 102 by a tester control using an internal test signal group S1 including an address signal, a data input/output signal, a control signal and the like. Thereafter, the testing unit 31 determines whether the redundant memory passes or fails the test. If the redundant memory fails the test, the testing unit 31 determines whether or not the redundant memory can be repaired/replaced by the redundancy scheme. The testing unit 31 outputs test result information S2 to the output unit 32. If the redundant memory cannot be repaired/replaced, the testing unit 31 outputs a relief inability signal STATUS. The output unit 32 outputs the relief information S3 to the first relief information storing unit 200, depending on whether or not repairing/replacement by the redundancy scheme is possible. It is assumed in this embodiment that when the relief information S3 is output, a relief information flag S6 is set to be in the "H" state, or when otherwise, the relief information flag S6 is set to be in the "L" state. The first relief information storing unit 200 can control data input to the shift registers L11, L12, . . . , and L1$x$ provided therein using the relief information flag S6.

It is also assumed in this embodiment that the test circuit 30 tests each redundant memory, and based on the result, the output unit 32 outputs the relief information flag S6 and the relief information S3 for each redundant memory. Note that when the output unit 32 outputs the relief information S3 to the first relief information storing unit 200, parallel transfer is performed in this embodiment, though serial transfer may be performed. It is also assumed in this embodiment that the operations of the redundant memories 101 and 102 and the testing of the redundant memories 101 and 102 by the test circuit 30 are executed in accordance with a first clock CK1, while the outputting of the relief information S3 by the output unit 32 is executed in accordance with a second clock CK2.

Hereinafter, an operation during a test phase will be described along a flow of testing with reference to FIGS. 1 and 2A.

Initially, in test step 1, the test circuit 30 tests the redundant memory 101. It is here assumed that the redundant memory 101 fails the test. A test result determination signal goes to "H". After the test is ended (a test end signal goes to the "H" state), the testing unit 31 determines whether or not the redundant memory 101 can be repaired/replaced by the redundancy scheme. When the redundant memory 101 can be repaired/replaced by the redundancy scheme, the output unit 32 causes the relief information flag S6 to go to the "H" state, and transfers, in parallel, the relief information S3 to the shift registers L11, L12, . . . , and L1x of the first relief information storing unit 200 in synchronization with the clock CK2.

Next, in test step 2, the test circuit 30 tests the redundant memory 102. It is here assumed that the redundant memory 102 passes the test (no defect is found). After the test is ended (the test end signal goes to the "H" state), the test result determination signal maintains "L". The testing unit 31 does not perform determination of whether or not the redundant memory 102 can be relieved. The relief information flag S6 of the output unit 32 remains in the "L" state. The relief information S3 is not transferred to the first relief information storing unit 200.

After the test circuit 30 has tested all target redundant memories (test step 2 is ended in this embodiment), a program step is started. Specifically, as shown in a program step of FIG. 2A, in the first relief information storing unit 200, the relief information S3 stored in the shift registers L11, L12, . . . , and L1x is used to program the electrical fuse elements F11, F12, . . . , and F1x in a predetermined time.

Note that, in this case, various controls are considered to be performed in the semiconductor device. For example, if, of the redundant memories sharing the second relief information storing unit 400, there are two or more redundant memories that have been determined to fail the test and not to be able to be relieved, and separate pieces of relief information are required, the chip cannot be relieved. Therefore, in such a case, a program operation is not performed.

Incidentally, a semiconductor device generally performs a resetting operation after power is turned on to initialize registers in the circuit before starting an operation. However, in the redundancy scheme of this embodiment, after initialization by resetting, it is further necessary to transfer relief information stored in an electrical fuse element of a first relief information storing unit to a second relief information storing unit connected to a redundant memory to be relieved.

Hereinafter, an operation of transferring relief information during an actual chip operation phase will be described with reference to FIG. 2B. In this embodiment, as described above, relief information for relieving the redundant memory 101 is stored in the electrical fuse elements F11, F12, . . . , and F1x of the first relief information storing unit 200. After a resetting operation after power is turned on, the relief information stored in the electrical fuse elements F11, F12, . . . , and F1x is set into the shift registers L11, L12, . . . , and L1x in the same unit. The relief information set in the shift registers L11, L12, . . . , and L1x is successively transferred to the shift registers La1, La2, . . . , and Lax of the second relief information storing unit 200 in synchronization with the clock CK2. Note that conditions may be provided so as to safely perform the operation of transferring relief information on a chip. In this embodiment, it is assumed that a transfer control signal CN is used, and when the conditions are satisfied ("H" state), a transfer enable signal S5 is formed in synchronization with the clock CK2, so that an operation of transferring relief information is performed. The transfer operation is assumed to require a period of time (transfer cycle (A)) shown in FIG. 2B.

As described above, according to the configuration of this embodiment, a plurality of redundant memories share a second relief information storing unit, so that the number of second relief information storing units is reduced. Therefore, a transfer cycle during which relief information is transferred from the first relief information storing unit 200 can be reduced (in this embodiment, only one cycle (transfer cycle (A)) is required). Thereby, a time required to transfer relief information after power is turned on can be reduced, thereby making it possible to reduce an offset time required until the start of a chip operation.

Second Embodiment

Figure 3:
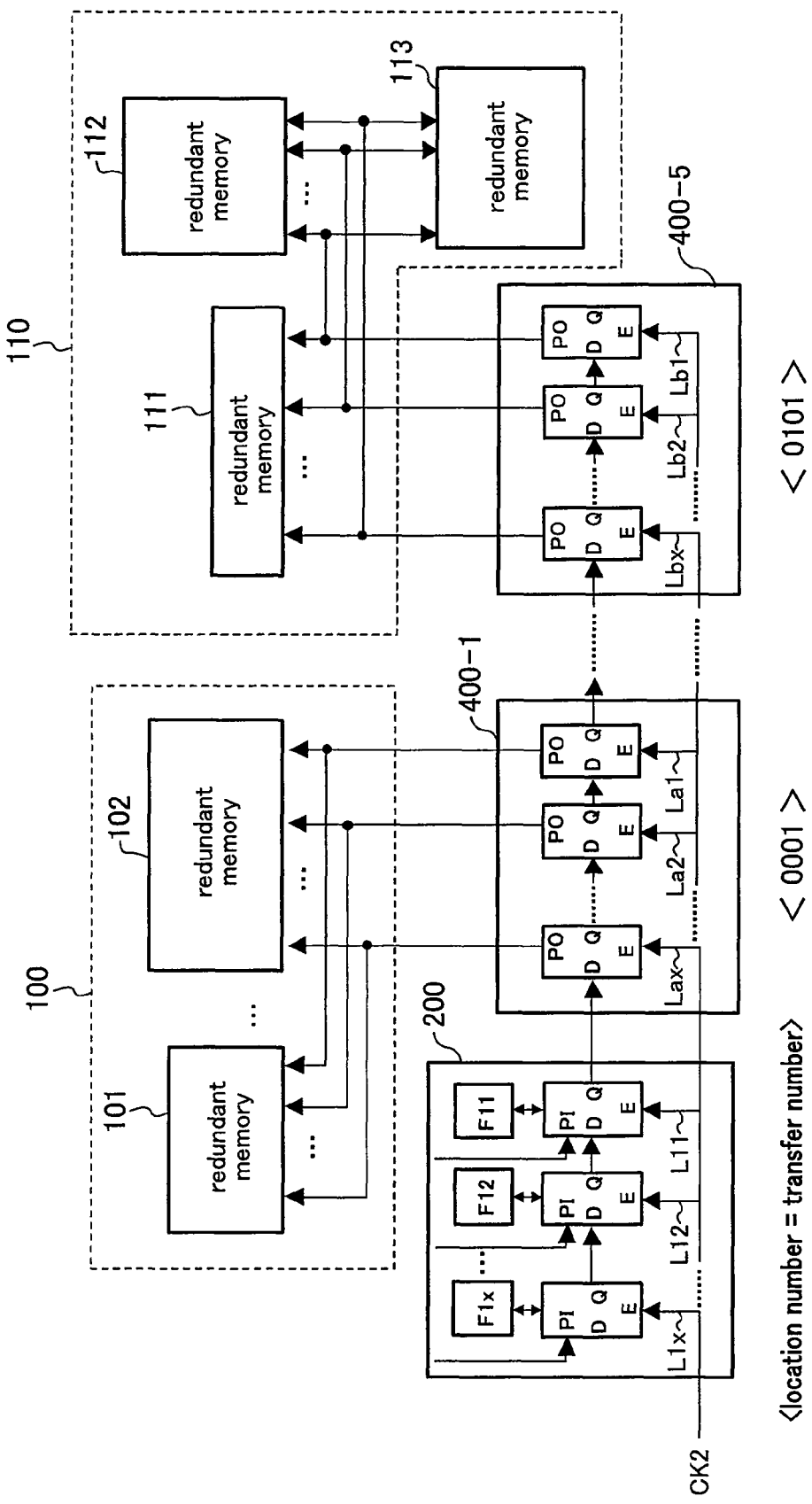
FIG. 3 is a block diagram showing a configuration of a semiconductor device according to a second embodiment of the present invention.
Figure 4:
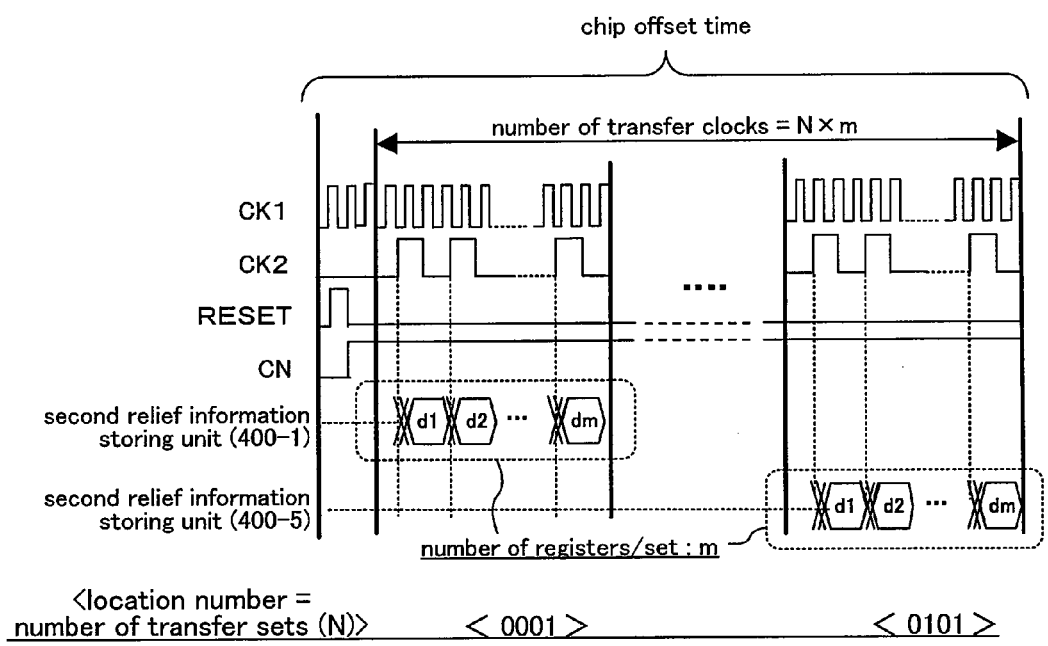
FIG. 4 is a timing chart showing an operation of transferring relief information, of operations relating to repairing/replacement by a redundancy scheme in the semiconductor device of this embodiment.

FIG. 3 is a block diagram showing a configuration of a semiconductor device according to a second embodiment of the present invention. FIG. 4 is a timing chart showing an operation of transferring relief information, of operations relating to repairing/replacement by a redundancy scheme in the semiconductor device of this embodiment.

The configuration of FIG. 3 is basically similar to that of FIG. 1. In FIG. 3, there are a plurality of combinations (five in FIG. 3) each of which includes a second relief information storing unit and a plurality of redundant memories sharing the unit. Specifically, the semiconductor device of FIG. 3 comprises second relief information storing units 400-1 to 400-5, a sharing redundant memory group 100 including redundant memories 101 and 102, and a sharing redundant memory group 110 including redundant memories 111, 112 and 113. The second relief information storing unit 400-1 is shared by the redundant memories 101 and 102, and the second relief information storing unit 400-5 is shared by the redundant memories 111, 112 and 113. Note that the second relief information storing units 400-2 to 400-4 and redundant memories sharing these units are not shown.

The second relief information storing units 400-1 to 400-5 each have shift registers for storing relief information. For example, the second relief information storing unit 400-1 has shift registers La1, La2, . . . , and Lax, and the second relief information storing unit 400-5 has shift registers Lb1, Lb2, . . . , and Lbx. The second relief information storing units 400-1 to 400-5 are connected in series to the first relief information storing unit 200 so that relief information can be successively transferred. The second relief information storing units 400-1 to 400-5 are given location numbers in order of connection. Thereby, relief information can be easily transferred from the first relief information storing unit 200 to the second relief information storing units 400-1 to 400-5 in accordance with a single clock CK2.

Another characteristic feature is such that, for all the first relief information storing unit 200 and the second relief information storing units 400-1 to 400-5, the number of shift registers included in each unit is constantly set to be m (m=x). In general, the number of pieces of relief information required by each redundant memory is determined, depending on the number of bits, the number of words, and the number of columns of the redundant memory. Therefore, the number of shift registers required to store the relief information varies among the units. However, in this embodiment, a plurality of second relief information storing units that constitute a transfer chain of relief information starting from the first relief information storing unit have the same number of shift registers.

Hereinafter, an operation of transferring relief information during an actual chip operation phase will be described with reference to FIG. 4. As described in the first embodiment, after a resetting operation after power is turned on, relief information stored in the electrical fuse elements F11, F12, . . . , and F1x of the first relief information storing unit 200 is set into the shift registers L11, L12, . . . , and L1x of the same unit. Thereafter, the relief information set in the shift registers L11, L12, . . . , and L1x is successively transferred in synchronization with the clock CK2 when the transfer control signal CN is in the "H" state.

It is here assumed for the sake of simplicity of the following description that information stored in one shift register is simply referred to as relief information, and a plurality of pieces of relief information required to relieve any redundant memory is referred to as a relief information set.

In order to obtain the effect of the characteristic feature of this embodiment that the second relief information storing units have the same number of shift registers, the following configuration is preferably provided, for example.

Specifically, initially, the number of clocks of the clock CK2 required to transfer a relief information set stored in the first relief information storing unit 200 to the second relief information storing units 400-1 to 400-5, is set to be an integral multiple of the number (m) of shift registers included in each of the second relief information storing units 400-1 to 400-5. Next, the ordinal numbers N of the second relief information storing units 400-1 to 400-5 are set as shown in FIG. 4, for example. Specifically, for example, the nearest second relief information storing unit 400-1 is given number 1 <0001>, and the farthest second relief information storing unit 400-5 is given number 5 <0101>. The numbers N are stored in the test circuit 30, the first relief information storing unit 200 or the like. Thereby, the number of clocks of the clock CK2 required to transfer a relief information set to a second relief information storing unit 400-N located at the $N^{th}$ position can be easily calculated by m×N.

As described above, according to the configuration of this embodiment, when a relief information set is transferred to any of a plurality of second relief information storing units connected in series to a first relief information storing unit, the number of clocks of a transfer clock can be easily set using information about an order in which second relief information storing units are arranged. Thereby, a complicated control for transferring relief information is not required, resulting in a reduction in area of a control circuit.

According to the present invention, in a semiconductor device having a redundant memory, the number of relief information storing units can be reduced, and relief information can be efficiently transferred. Therefore, for example, the present invention is useful to reduce the circuit area of a semiconductor device having a large number of memories.

What is claimed is:

1. A semiconductor device comprising:
   a plurality of redundant memories each having a plurality of memory cells and having a function of relieving a defective cell that is a defective one of the plurality of memory cells, wherein the plurality of redundant memories can each operate independently;
   a first relief information storing unit for storing relief information for relieving the redundant memory having a defective cell; and
   a second relief information storing unit for receiving and storing the relief information transferred from the first relief information storing unit,
   wherein the second relief information storing unit is provided outside the redundant memory and is shared by the plurality of redundant memories, and
   the plurality of redundant memories can execute a relief process with respect to a defective cell using the relief information stored in the second relief information storing unit.

2. The semiconductor device of claim 1, wherein
   the first and second relief information storing units each have shift registers for storing the relief information and are each configured to successively transfer the relief information by a shifting operation of the shift registers.

3. The semiconductor device of claim 2, wherein
   a plurality of combinations each including the plurality of redundant memories and the second relief information storing unit are provided, and
   the plurality of the second relief information storing units are connected in series to the first relief information storing unit so that the relief information can be successively transferred.

4. The semiconductor device of claim 3, wherein
   the plurality of the second relief information storing units have the same number of the shift registers.

5. The semiconductor device of claim 1, wherein
   the plurality of redundant memories have a different bit configuration or word configuration, and share the whole or a portion of the relief information stored in the second relief information storing unit.

6. The semiconductor device of claim 1, wherein
   the first relief information storing unit has an electrical fuse element for storing the relief information.

7. The semiconductor device of claim 1, wherein
   the first relief information storing unit has a non-volatile memory element for storing the relief information.

8. The semiconductor device of claim 1, wherein
   the relief information is directly transferred from shift registers included in the first relief information storing unit to shift registers included in the second relief information storing unit.

* * * * *